United States Patent
Liu et al.

(10) Patent No.: US 9,159,831 B2
(45) Date of Patent: Oct. 13, 2015

(54) MULTIGATE FIELD EFFECT TRANSISTOR AND PROCESS THEREOF

(71) Applicant: UNITED MICROELECTRONICS CORP., Hsin-Chu (TW)

(72) Inventors: Chih-Chien Liu, Taipei (TW);
Chun-Yuan Wu, Yun-Lin (TW);
Chin-Fu Lin, Tainan (TW);
Chin-Cheng Chien, Tainan (TW);
Chia-Lin Hsu, Tainan (TW)

(73) Assignee: UNITED MICROELECTRONICS CORP., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 13/662,561

(22) Filed: Oct. 29, 2012

(65) Prior Publication Data
US 2014/0117455 A1 May 1, 2014

(51) Int. Cl.
| H01L 21/70 | (2006.01) |
| H01L 29/78 | (2006.01) |
| H01L 21/764 | (2006.01) |
| H01L 29/66 | (2006.01) |
| H01L 21/02 | (2006.01) |
| H01L 27/11 | (2006.01) |

(52) U.S. Cl.
CPC ............ *H01L 29/785* (2013.01); *H01L 21/764* (2013.01); *H01L 29/66795* (2013.01); *H01L 21/02225* (2013.01); *H01L 27/11* (2013.01); *H01L 29/66484* (2013.01)

(58) Field of Classification Search
CPC ............ H01L 21/764; H01L 29/66795; H01L 29/785; H01L 27/11; H01L 27/1104; H01L 27/823807; H01L 2029/7858; H01L 21/02225; H01L 29/66484

USPC ............ 257/368, 288, 347, 77, 255; 438/151, 438/283, 720
See application file for complete search history.

(56) References Cited

U.S. PATENT DOCUMENTS

| 6,043,138 A | 3/2000 | Ibok |
| 6,492,216 B1 | 12/2002 | Yeo |
| 6,921,963 B2 | 7/2005 | Krivokapic |
| 7,087,477 B2 | 8/2006 | Fried |
| 7,091,551 B1 | 8/2006 | Anderson |
| 7,247,887 B2 | 7/2007 | King |
| 7,250,658 B2 | 7/2007 | Doris |
| 7,309,626 B2 | 12/2007 | Ieong |
| 7,352,034 B2 | 4/2008 | Booth, Jr. |
| 7,381,649 B2 * | 6/2008 | Chen et al. .................... 438/700 |
| 7,470,570 B2 | 12/2008 | Beintner |
| 7,531,437 B2 | 5/2009 | Brask |
| 7,569,857 B2 | 8/2009 | Simon, legal representative |
| 8,377,779 B1 * | 2/2013 | Wang ........................... 438/283 |
| 2003/0176055 A1 * | 9/2003 | Wu ............................... 438/618 |

(Continued)

*Primary Examiner* — Mohammed Shamsuzzaman
(74) *Attorney, Agent, or Firm* — Winston Hsu; Scott Margo

(57) ABSTRACT

A multigate field effect transistor includes two fin-shaped structures and a dielectric layer. The fin-shaped structures are located on a substrate. The dielectric layer covers the substrate and the fin-shaped structures. At least two voids are located in the dielectric layer between the two fin-shaped structures. Moreover, the present invention also provides a multigate field effect transistor process for forming said multigate field effect transistor including the following steps. Two fin-shaped structures are formed on a substrate. A dielectric layer covers the substrate and the two fin-shaped structures, wherein at least two voids are formed in the dielectric layer between the two fin-shaped structures.

7 Claims, 6 Drawing Sheets

(56) References Cited

U.S. PATENT DOCUMENTS

| | | |
|---|---|---|
| 2004/0195624 A1 | 10/2004 | Liu |
| 2005/0051825 A1 | 3/2005 | Fujiwara |
| 2005/0239254 A1* | 10/2005 | Chi et al. .................. 438/270 |
| 2006/0099830 A1 | 5/2006 | Walther |
| 2006/0286729 A1 | 12/2006 | Kavalieros |
| 2007/0108528 A1 | 5/2007 | Anderson |
| 2007/0158756 A1 | 7/2007 | Dreeskornfeld |
| 2008/0157208 A1 | 7/2008 | Fischer |
| 2009/0124097 A1 | 5/2009 | Cheng |
| 2009/0242964 A1 | 10/2009 | Akil |
| 2009/0269916 A1 | 10/2009 | Kang |
| 2010/0048027 A1 | 2/2010 | Cheng |
| 2010/0072553 A1 | 3/2010 | Xu |
| 2010/0144121 A1 | 6/2010 | Chang |
| 2010/0167506 A1 | 7/2010 | Lin |
| 2010/0258870 A1 | 10/2010 | Hsu |
| 2013/0017654 A1* | 1/2013 | Huang et al. .................. 438/151 |
| 2014/0001520 A1* | 1/2014 | Glass et al. .................. 257/288 |

* cited by examiner

MULTIGATE FIELD EFFECT TRANSISTOR AND PROCESS THEREOF

BACKGROUND OF THE INVENTION

1. Field of the Invention

The present invention relates generally to a multigate field effect transistor and a process thereof, and more specifically to a multigate field effect transistor and a process thereof that forms voids in a dielectric layer between fin-shaped structures.

2. Description of the Prior Art

With increasing miniaturization of semiconductor devices, various multi-gate MOSFET devices have been developed. The multi-gate MOSFET is advantageous for the following reasons. First, manufacturing processes of multi-gate MOSFET devices can be integrated into traditional logic device processes, and thus are more compatible. In addition, since the three-dimensional structure of the multi-gate MOSFET increases the overlapped area between the gate and the substrate, the channel region is controlled more effectively. This therefore reduces drain-induced barrier lowering (DIBL) effect and short channel effect. Moreover, the channel region is longer for the same gate length. Therefore, the current between the source and the drain is increased.

A multigate field effect transistor component includes fin-shaped structures on a substrate, and a gate structure and a source/drain on each of the fin-shaped structures, to form multigate field effect transistors having multi gate channels. However, assizes of multigate field effect transistors shrink, the parasitic capacitances between each of the fin-shaped structures become large and degrade electrical performances of the multigate field effect transistors.

SUMMARY OF THE INVENTION

The present invention provides a multigate field effect transistor and a process thereof, which forms voids in a dielectric layer between two fin-shaped structures, so that the parasitic capacitances of the multigate field effect transistor can be reduced, and the aforesaid problem can therefore be solved.

The present invention provides a multigate field effect transistor including two fin-shaped structures and a dielectric layer. The two fin-shaped structures are located on a substrate. The dielectric layer covers the substrate and the two fin-shaped structures, and at least two voids are located in the dielectric layer between the two fin-shaped structures.

The present invention provides a multigate field effect transistor process including the following steps. Two fin-shaped structures are formed on a substrate. A dielectric layer is formed to cover the substrate and the two fin-shaped structures, wherein at least two voids are formed in the dielectric layer between the two fin-shaped structures.

According to the above, the present invention provides a multigate field effect transistor and a process thereof, which forms voids in a dielectric layer between two fin-shaped structures, so that the parasitic capacitances of the multigate field effect transistor, especially between the fin-shaped structures, can be reduced. Moreover, processes for forming a dielectric layer with voids in the dielectric layer between the fin-shaped structures in the present invention can reduce processing costs compared to processes intended to fully fill the dielectric layer (with no voids).

These and other objectives of the present invention will no doubt become obvious to those of ordinary skill in the art after reading the following detailed description of the preferred embodiment that is illustrated in the various figures and drawings.

DETAILED DESCRIPTION

Figure 1:
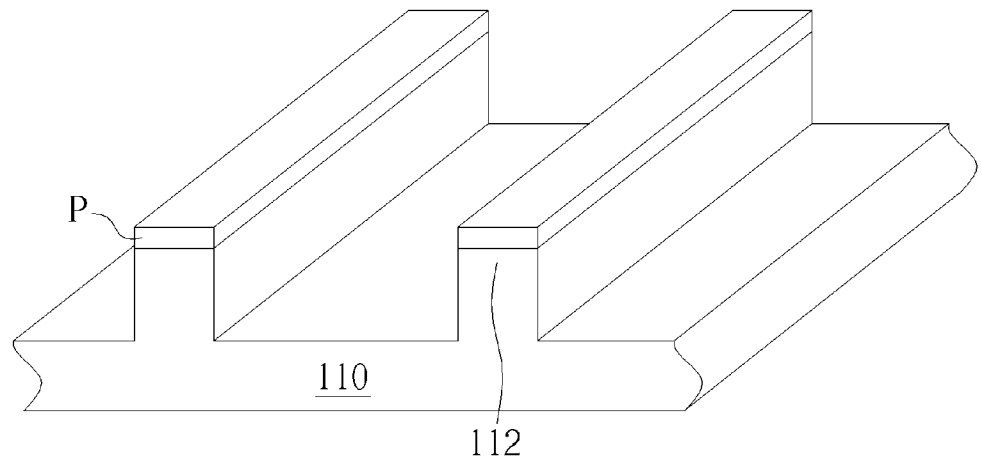
FIGS. 1-7 schematically depict cross-sectional views of a multigate field effect transistor process according to a first embodiment of the present invention.

FIGS. 1-7 schematically depict cross-sectional views of a multigate field effect transistor process according to a first embodiment of the present invention. A plurality of fin-shaped structures is formed on a substrate. As shown in FIG. 1, two fin-shaped structures 112 are formed on a substrate 110. The substrate 110 may be a semiconductor substrate such as a silicon substrate, a silicon containing substrate, a III-V group-on-silicon (such as GaN-on-silicon) substrate, a graphene-on-silicon substrate or a silicon-on-insulator (SOI) substrate. In details, the method of forming the two fin-shaped structures 112 on the substrate 110 may include the following steps. A bulk bottom substrate (not shown) is provided. A hard mask layer (not shown) is formed on the bulk bottom substrate (not shown) and is patterned to define the location of the fin-shaped structures 112, which will be formed in the bulk bottom substrate (not shown). An etching process is performed to form the fin-shaped structures 112 in the bulk bottom substrate (not shown). Thus, the fin-shaped structure 112 located on the substrate 110 is formed. In one embodiment, the hard mask layer (not shown) is removed after the fin-shaped structure 112 is formed, and a tri-gate MOSFET can be formed in the following processes. There are three contact faces between each of the fin structures 112 and the later formed dielectric layer functioning as a carrier channel which width is wider than a channel width of a conventional planar MOSFET. When a driving voltage is applied, the tri-gate MOSFET produces a twice higher on-current compared to the conventional planar MOSFET. In another embodiment, the hard mask layer (not shown) is reserved to form a fin field effect transistor (Fin FET), which is another kind of multi-gate MOSFET. Due to the hard mask layer (not shown) being reserved in the fin field effect transistor, there are only two contact faces between the fin structure 112 and the later formed dielectric layer.

The present invention can also be processed with other semiconductor substrates. For example, a silicon-on-insulator substrate (not shown) is provided, and then a single crystalline silicon layer being a top part of the silicon-on-insulator substrate (not shown) is etched till an oxide layer being a middle part of the silicon-on-insulator substrate (not shown) is exposed, meaning that the fin-shaped structure formed in the silicon-on-insulator substrate (not shown) is finished.

To clarify the present invention, two fin-shaped structures 112 are depicted in this embodiment, but the present invention can also be applied to three or more than three fin-shaped structures 112 matrix assemblies.

Figure 2:
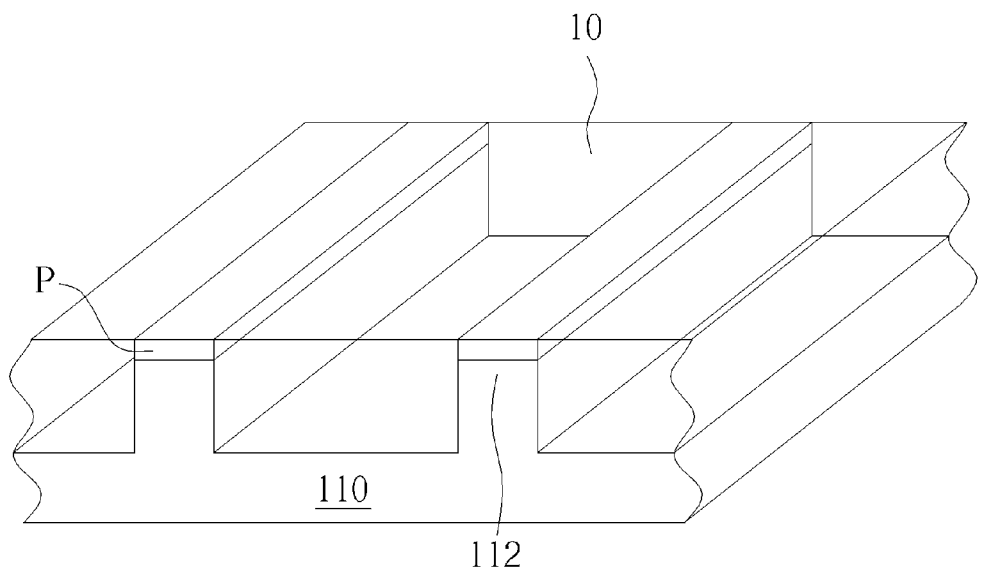

As shown in FIG. 2, an isolation structure 10 is formed on the substrate 110 between the two fin-shaped structures 112. The isolation structure 10 maybe a shallow trench isolation (STI) structure, formed by a shallow trench isolation (STI) process, and the forming details are known in the art and are not described herein, but the present invention is not restricted thereto. For instance, an isolating layer (not shown) may be formed to entirely cover the two fin-shaped structures 112 and fill the substrate 110 between the two fin-shaped structures 112.

Figure 3:
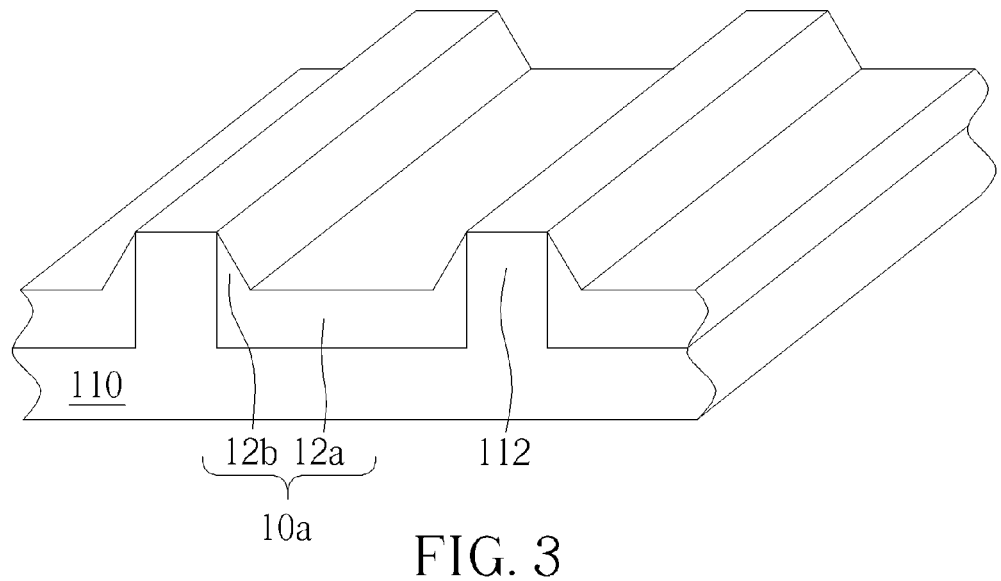

The isolation structure 10 is etched back to form an isolation structure 10a as shown in FIG. 3. In this embodiment, the isolation structure 10a has a bottom part 12a and two sidewall parts 12b, wherein the bottom part 12a is located on the substrate 110 between the two fin-shaped structures 112 and the two sidewall parts 12b are respectively located on the corresponding two sides of the two fin-shaped structures 112. Therefore, an epitaxial structure formed later can be restricted to grow upward from the fin-shaped structures 112 without growing downward to cover the sidewalls of each of the fin-shaped structures 112. In another embodiment, the isolation structure 10 may not be etched back, depending upon the needs.

Figure 4:
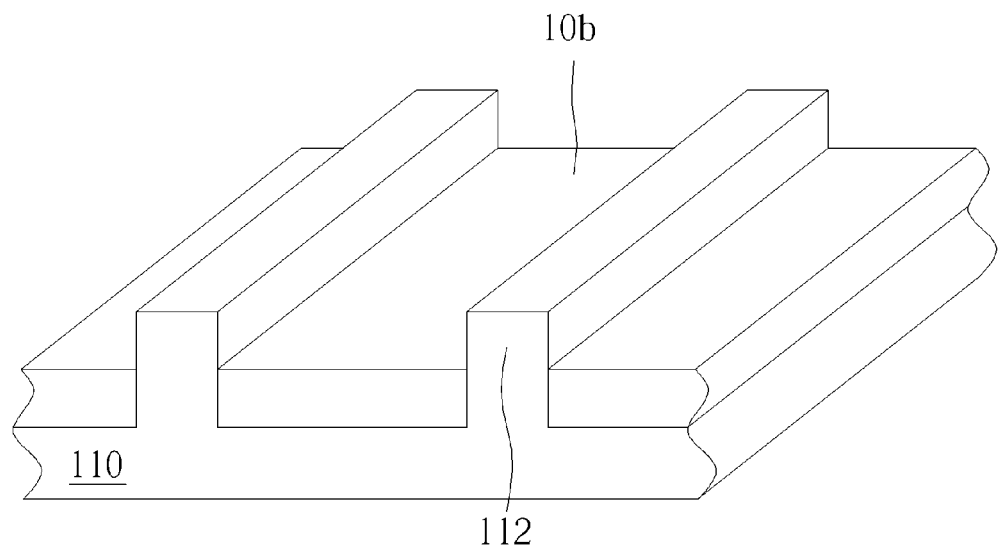

In another case, the isolation structure 10 may be etched back to form an isolation structure 10b, which is only located on the substrate 110 between the two fin-shaped structures 112 without being further located on the sidewalls of the fin-shaped structures 112 as shown in FIG. 4. Then, a spacer (not shown) may be selectively formed on the sidewalls of each of the fin-shaped structures 112, depending upon the processing or structural needs. Moreover, in a silicon-on-insulator substrate embodiment, a spacer (not shown) may be selectively formed on the sidewalls of each of the fin-shaped structures after the fin-shaped structures formed by etching the single crystalline silicon layer till the oxide layer is exposed.

Figure 5:
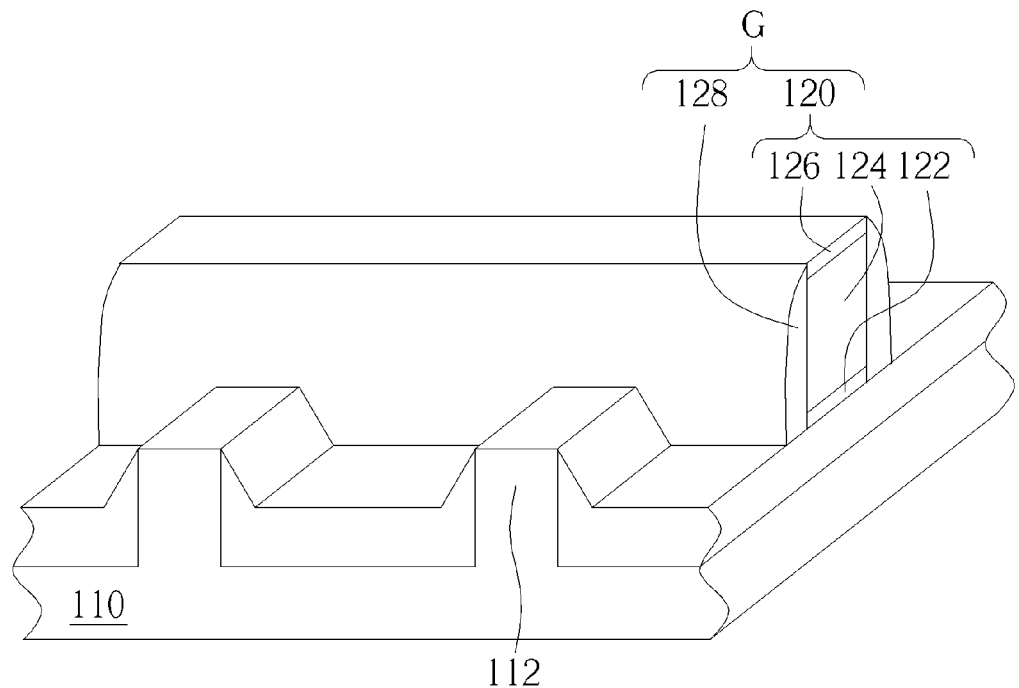

As shown in FIG. 5, a gate structure G is formed across the substrate 110 and each of the fin-shaped structures 112, wherein the gate structure G includes a buffer layer (not shown), a gate dielectric layer 122, a barrier layer (not shown), an electrode layer 124, a cap layer 126 and a spacer 128. More precisely, the buffer layer (not shown), the gate dielectric layer 122, the barrier layer (not shown), the electrode layer 124 and the cap layer 126 form a stacked structure 120, and the spacer 128 is formed on the substrate 110 beside the stacked structure 120. The method of forming the gate structure G may include the following steps. The buffer layer (not shown), the dielectric layer (not shown), the barrier layer (not shown), the electrode layer (not shown) and the cap layer (not shown) are sequentially formed on the substrate 110 and the fin-shaped structures 112 and are patterned to form the stacked structure 120 including the buffer layer (not shown), the gate dielectric layer 122, the barrier layer (not shown), the electrode layer 124 and the cap layer 126. Then, a spacer material (not shown) may be formed to entirely cover the stacked structure 120, the fin-shaped structures 112 and the substrate 110, and then be patterned to form the spacer 128 on the substrate 110 and the fin-shaped structures 112 beside the stacked structure 120.

The buffer layer (not shown) may be an oxide layer, which may be formed through a chemical oxide process or a thermal oxide process, but it is not limited thereto. The buffer layer (not shown) is located between the gate dielectric layer 122 and the substrate 110 to buffer the gate dielectric layer 122 and the substrate 110. A gate-last for high-k first process is applied in this embodiment, so that the gate dielectric layer 122 is a gate dielectric layer having a high dielectric constant, which may be the group selected from hafnium oxide (HfO2), hafnium silicon oxide (HfSiO4), hafnium silicon oxynitride (HfSiON), aluminum oxide (Al2O3), lanthanum oxide (La2O3), tantalum oxide (Ta2O5), yttrium oxide (Y2O3), zirconium oxide (ZrO2), strontium titanate oxide (SrTiO3), zirconium silicon oxide (ZrSiO4), hafnium zirconium oxide (HfZrO4), strontium bismuth tantalite (SrBi2Ta2O9, SBT), lead zirconate titanate (PbZrxTi1-xO3, PZT) and barium strontium titanate (BaxSr1-xTiO3, BST), but it is not limited thereto. In another embodiment, as a gate-last for high-k last process is applied, the gate dielectric layer 122 will be removed in later processes and then a gate dielectric layer having a high dielectric constant is formed. Therefore, the material of the gate dielectric layer 122 maybe just a sacrificial material suitable for being removed in later processes. The barrier layer (not shown) is located on the gate dielectric layer 122 to be served as an etching stop layer to protect the gate dielectric layer 122 while removing the electrode layer 124 and to prevent above disposed metals from diffusing downwards to the gate dielectric layer 122 and from polluting the gate dielectric layer 122. The barrier layer (not shown) may be a single layer structure or a multilayer structure composed of tantalum nitride (TaN) or titanium nitride (TiN) etc. The electrode layer 124 may be made of polysilicon, but it is not limited thereto. The cap layer 126 maybe a single layer or a multilayer composed of a nitride layer or an oxide layer etc used to be a patterned hard mask, but it is not limited thereto. The spacer 128 may be a single layer structure or a multilayer structure composed of silicon nitride or silicon oxide etc.

Figure 6:
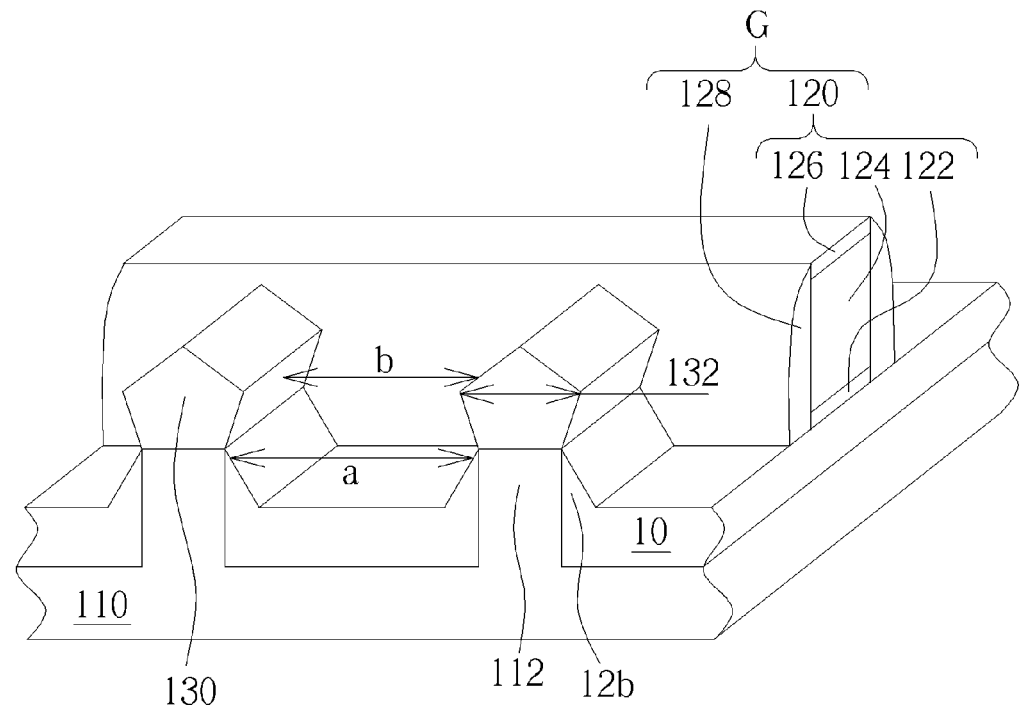

As shown in FIG. 6, an epitaxial structure 130 is selectively formed on each of the fin-shaped structures 112. The epitaxial structures 130 may be a silicon germanium epitaxial structure used to form an epitaxial structure of a PMOS transistor; or a silicon carbide epitaxial structure used to form an epitaxial structure of an NMOS transistor, but it is not limited thereto. In this embodiment, due to the sidewall parts 12b of the isolation structure 10 covering the sidewalls of the fin-shaped structures 112, the epitaxial structures 130 formed by an epitaxial technology can grow upward and have pentagon structures without covering the fin-shaped structures 112. In this embodiment, the cross-sectional profile of the epitaxial structure 130 has a lateral widest part 132, enabling an opening narrowing from middle to top (the middle width a being larger than the opening width b as shown in FIG. 6) being formed between the fin-shaped structures 112, so that voids can be formed easily between the fin-shaped structures 112 and below the lateral widest parts 132 of the epitaxial structures 130 as the dielectric layer is formed later to entirely cover the substrate 110 and the epitaxial structures 130, but it is not limited thereto. In another embodiment, the shapes of the epitaxial structures 130 can be controlled by adjusting the depth and the shape of the isolation structure 10 after etching back.

Sources/drains (not shown) are then respectively formed in the epitaxial structures 130 or/and the fin-shaped structures 112 beside the gate structure G. In another embodiment, the sources/drains (not shown) may be formed before the epitaxial structures 130 are formed, or the sources/drains (not shown) and the epitaxial structures 130 may be formed at the same time. It is emphasized that, parts of the isolation structure 10 may be selectively etched after the gate structure G and the epitaxial structures 130 are formed on the fin-shaped structures 112 to enlarge the gaps between each of the fin-shaped structures 112. No matter whether the isolation structure 10 is etched in previous processing steps, or if a spacer (not shown) is respectively formed on the sidewalls of each of the fin-shaped structures 112 or not. These depend upon the device requirements.

Figure 7:
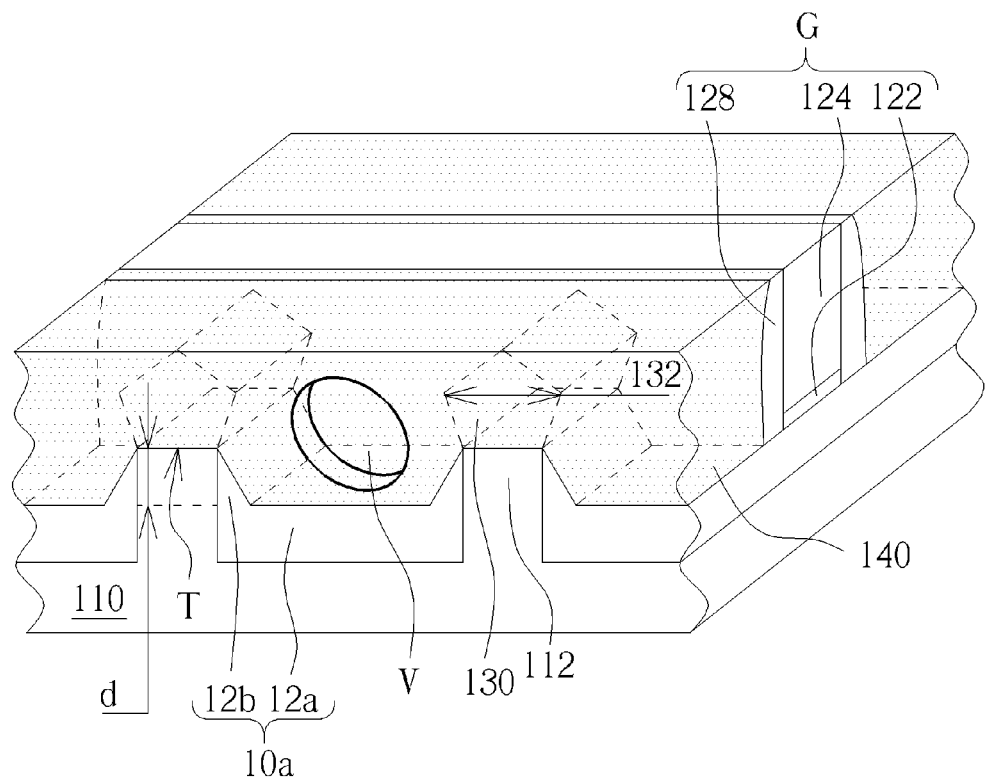

As shown in FIG. 7, a dielectric layer 140 is formed to cover the substrate 110 and the fin-shaped structures 112, wherein two voids are respectively formed in the dielectric layer 140 between the fin-shaped structures 112 beside the gate structure G. The dielectric layer 140 may be a chemical vapor deposition (CVD) process, a Plasma Enhance Chemical Vapor Deposition (PECVD) process or a High-density plasma chemical vapor deposition (HDPCVD) process etc. The process for forming the dielectric layer 140 is preferred to form the voids V in the dielectric layer 140 as the dielectric layer 140 is formed. Moreover, the positions of the voids can be controlled by adjusting the depth d of the isolation structure 10a or 10b being etched. For example, the positions of the voids can be controlled by adjusting the depth as the isolation structure 10a is formed or the depth of the isolation structure 10a that is determined by etching after the gate structure G and the epitaxial structure 130 are formed. Besides, the shapes and the sizes of the voids V can be controlled by adjusting the shapes of the isolation structure 10a. Furthermore, the locations, the sizes and the shapes of the voids can also be controlled by the epitaxial structures 130 formed on the fin-shaped structures 112. In this embodiment, due to the cross-sectional profile of the epitaxial structure 130 having a lateral widest part 132, enabling an opening narrowing from middle to top formed between each of the fin-shaped structures 112, the dielectric layer 140 is hard to be filled into the space on the substrate between the fin-shaped structures 112 as the dielectric layer 140 covers the fin-shaped structures 112 and the substrate 110, so voids V can be formed in the dielectric layer 140 between each of the fin-shaped structures 112. More precisely, voids V are located below the lateral widest parts 132. In addition, the epitaxial structures 130 may not be formed, but the positions, the sizes and the shapes of the voids can still be controlled by adjusting the depth and the shape of the isolation structure 10a or 10b, wherein the voids V are preferred to be under the level of the top of the fin-shaped structures 112.

Figure 11:
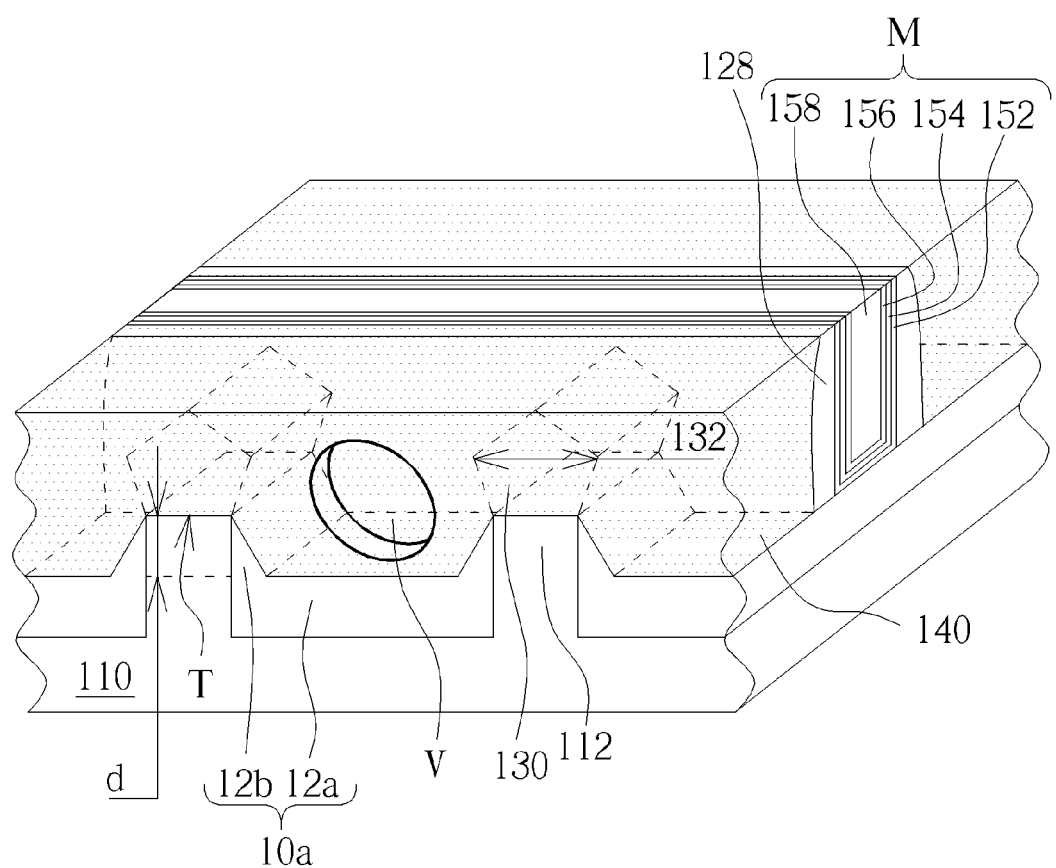
FIG. 11 schematically depicts a cross-sectional view of a multigate field effect transistor process according to an embodiment of the present invention.

The step of forming the dielectric layer 140 may include: entirely covering the dielectric layer (not shown) on the substrate 110, the fin-shaped structures 112 and the gate structure G; the dielectric layer (not shown) is then planarized until the electrode layer 124 is exposed (, as shown in FIG. 7). Then, a metal gate replacement (RMG) process is performed to replace the electrode layer 124 and the gate dielectric layer 122 by a metal gate M, as shown in FIG. 11. More precisely, the electrode layer 124 is removed and the gate dielectric layer 122 may optionally be removed; then, an optional buffer layer (not shown), a dielectric layer having a high dielectric constant (not shown), a selective bottom barrier layer (not shown), a work function metal layer (not shown), a selective top barrier layer (not shown) and a low resistivity material (not shown) are sequentially formed and polished until the dielectric layer 140 being exposed, meaning the metal gate M being formed, wherein the metal gate M includes a buffer layer 152, a dielectric layer having a high dielectric constant 154, a selective bottom barrier layer (not shown), a work function metal layer 156, a selective top barrier layer (not shown) and a low resistivity material 158. Thus, the buffer layer 152, the dielectric layer having a high dielectric constant 154, the selective bottom barrier layer (not shown), the work function metal layer 156 and the selective top barrier layer (not shown) are all have U-shaped cross-sectional profiles. Then, sequential semiconductor processes may be performed to form a desired semiconductor structure. In another embodiment, the gate dielectric layer 122 is not removed to serve as buffer layer. Under this circumstance, there is no need to form a buffer layer after removing the electrode layer 124 and the buffer layer 152 of the final structure would have a linear cross-sectional profile instead of a U-shaped one.

Above all, in this embodiment, the isolation structure 10 is formed on the substrate 110 between the fin-shaped structures 112, and the isolation structure 10 is etched back to form the isolation structure 10a; the gate structure G is formed and across the fin-shaped structures 112 and the substrate 110; the epitaxial structures 130 are formed on the fin-shaped structures 112 beside the gate structure G; the dielectric layer 140 is formed to entirely cover the substrate 110 and the epitaxial structures 130, and the voids V are simultaneously formed in the dielectric layer 140 between the fin-shaped structures 112. Moreover, the multigate field effect transistor process of the present invention can also be applied to various semiconductor processes. Another embodiment is presented in the following, which forms epitaxial structures 130, etches back the isolation structure 10 and then forms the gate structure G.

Figure 8:
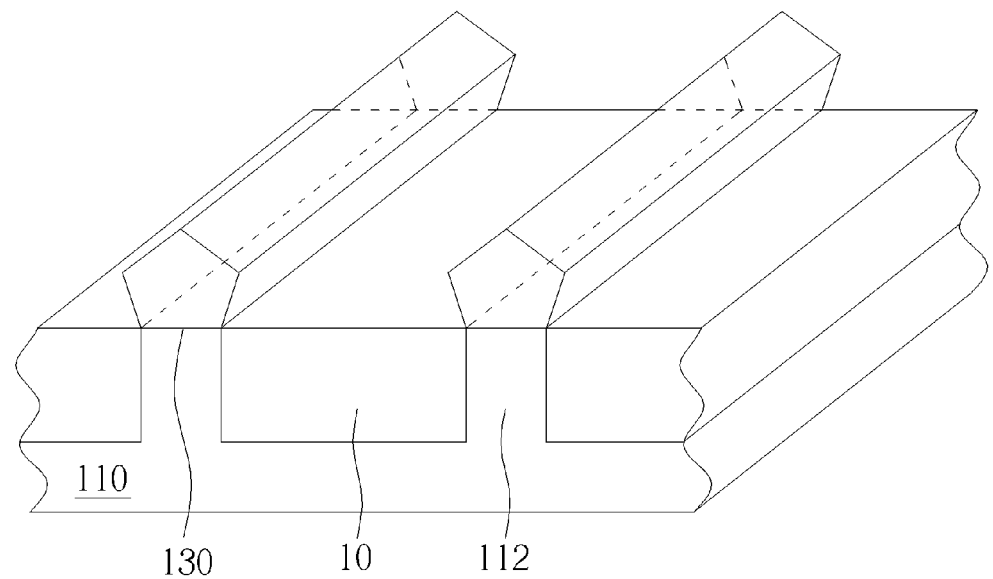
FIGS. 8-9 schematically depict cross-sectional views of a multigate field effect transistor process according to a second embodiment of the present invention.
Figure 9:
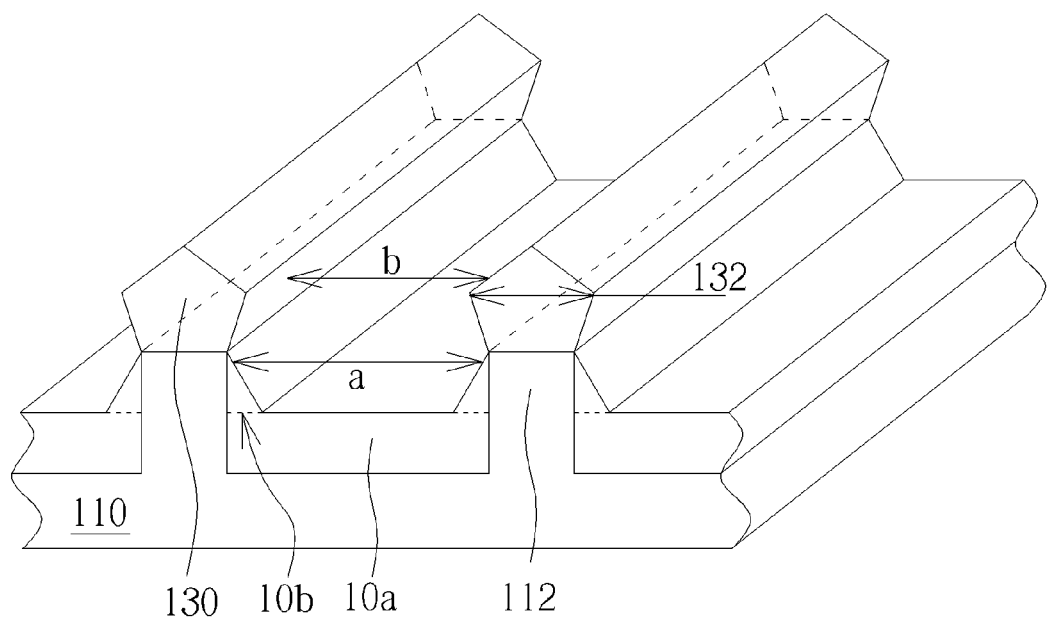

FIGS. 8-9 schematically depict cross-sectional views of a multigate field effect transistor process according to a second embodiment of the present invention. The previous processes of this embodiment are common to the former embodiment (as shown in FIGS. 1-2), including two fin-shaped structures 112 formed on a substrate 110 (as shown in FIG. 1); an isolation structure 10 is formed on the substrate 110 between the two fin-shaped structures 112 (as shown in FIG. 2). Then, an epitaxial structure 130 is formed on each of the fin-shaped structures 112 without etching back the isolation structure 10 first as shown in FIG. 8. Thereafter, the isolation structure 10 is etched back to form an isolation structure 10a as shown in FIG. 9. It is worth noting that, the isolation structure 10a including a bottom part 12a and the two sidewall parts 12b are formed in the former embodiment to isolate the fin-shaped structures 112, enabling the epitaxial structures 130 to grow upward so that the voids V can be formed in the dielectric layer, wherein the bottom part 12a is located on the substrate 110 between the two fin-shaped structures 112 and the sidewall parts 12b are respectively located on the corresponding two sides of the two fin-shaped structures 112. In this embodiment, since the epitaxial structures 130 are formed before the isolation structure 10 is etched, the isolation structure 10 can isolate the fin-shaped structures 112, and the epitaxial structures 130 can therefore grow upward. Thus, the sidewall parts 12b of the isolation structure 10a on the sidewalls of the fin-shaped structures 112 can not be reserved as the isolation structure 10 is etched back. This way, the isolation structure 10b may be formed instead (as the dotted line shown in FIG. 10). Even more, an isotropic etching process such as a wet etching process may be performed to entirely remove the isolation structure 10 between the fin-shaped structures 112. The isolation structure 10a is used in this embodiment to be similar to that of FIGS. 6-7 and for better illustration, but it is not limited thereto.

Moreover, the epitaxial structures 130 in this embodiment are common to the epitaxial structures 130 in the former embodiment. That is, the epitaxial structures 130 are preferred to have pentagon structures without covering the fin-shaped structures 112. In this embodiment, the cross-sectional profile of each of the epitaxial structure 130 has a lateral widest part 132, enabling an opening narrowing from middle to top (the middle width a being larger than the opening width b as shown in FIG. 9) being formed between the fin-shaped structures 112, so that voids can be formed easily between the fin-shaped structures 112 and below the level of the lateral widest part 132 of each of the epitaxial structure 130 as the dielectric layer is formed later to entirely cover the substrate 110 the epitaxial structures 130, but it is not limited thereto. Moreover, since an epitaxial structure 130 is formed on the top of each of the whole fin-shaped structures 112, the epitaxial structure 130 may just be a silicon epitaxial structure, and the epitaxial structure 130 can be a polyhedron because of the specific growing angles. In this way, there are multi contact faces between the epitaxial structures 130 and the gate structure formed later, thereby forming a multigate field effect transistor having a gate channel width. In addition, the epitaxial structure 130 may be a silicon germanium epitaxial structure for forming a PMOS transistor, or the epitaxial structure 130 may be a silicon carbide epitaxial structure for forming an NMOS transistor, but it is not limited thereto.

Then, as shown in FIG. 6, the gate structure G is formed on the epitaxial structures 130 and the substrate 110, wherein the gate structure G includes a buffer layer (not shown), a gate dielectric layer 122, a barrier layer (not shown), an electrode layer 124, a cap layer 126 and a spacer 128, and the forming method is the same as that of the former embodiment and is not described again. Sources/drains (not shown) are then respectively formed in the epitaxial structures 130 or/and the fin-shaped structures 112 beside the gate structure G. In another embodiment, sources/drains (not shown) may be formed before the epitaxial structures 130 are formed, or the sources/drains (not shown) and the epitaxial structures 130 may be formed at the same time. Then, later semiconductor processes may be performed to form a desired semiconductor structure.

As shown in FIG. 7, a dielectric layer 140 is formed to cover the substrate 110 and the epitaxial structures 130, wherein two voids are respectively formed in the dielectric layer 140 between the fin-shaped structures 112 beside the gate structure G. The dielectric layer 140 maybe a chemical vapor deposition (CVD) process, a Plasma Enhance Chemical Vapor Deposition (PECVD) process or a High-density plasma chemical vapor deposition (HDPCVD) process etc. The process for forming the dielectric layer 140 is preferred to form the voids V in the dielectric layer 140 when the dielectric layer 140 is formed. Moreover, the positions of the voids can be controlled by adjusting the depth d of the isolation structure 10a and the shapes and the sizes of the voids V can be controlled by adjusting the shape of the isolation structure 10a. Furthermore, the locations, the sizes and the shapes of the voids can also be controlled by the epitaxial structures 130 formed on the fin-shaped structures 112. In this embodiment, due to the cross-sectional profile of the epitaxial structure 130 having a lateral widest part 132, enabling an opening narrowing from middle to top formed between each of the fin-shaped structures 112, the dielectric layer 140 is hard to be filled into the space on the substrate between the fin-shaped structures 112 as the dielectric layer 140 covers the epitaxial structures 130 and the substrate 110, so that voids V can be formed in the dielectric layer 140 between each of the fin-shaped structures 112. More precisely, voids V are located below the level of the lateral widest parts 132. In addition, the epitaxial structures 130 may not be formed, but the positions, the sizes and the shapes of the voids can still be controlled by adjusting the depth and the shape of the isolation structure 10a, wherein the voids V are preferred to be located below the level of the top T of the fin-shaped structures 112.

It is emphasized that, parts of the isolation structure 10a may be selectively etched after the gate structure G or/and the epitaxial structures 130 are formed on the fin-shaped structures 112 to enlarge the gaps between each of the fin-shaped structures 112, but this depends upon the device requirements.

The step of forming the dielectric layer 140 may include: entirely covering the dielectric layer (not shown) on the substrate 110, the fin-shaped structures 112 and the gate structure G; the dielectric layer (not shown) is then planarized until the electrode layer 124 is exposed (, as shown in FIG. 7). Then, a metal gate replacement (RMG) process is performed to replace the electrode layer 124 and the gate dielectric layer 122 by a metal gate M, as shown in FIG. 11. More precisely, the electrode layer 124 is removed and the gate dielectric layer 122 is optionally removed; then, an optional buffer layer (not shown), a dielectric layer having a high dielectric constant (not shown), a selective bottom barrier layer (not shown), a work function metal layer (not shown), a selective top barrier layer (not shown) and a low resistivity material (not shown) are sequentially formed and polished until the dielectric layer 140 being exposed, meaning the metal gate M being formed, wherein the metal gate M includes a buffer layer 152, a dielectric layer having a high dielectric constant 154, a selective bottom barrier layer (not shown), a work function metal layer 156, a selective top barrier layer (not shown) and a low resistivity material 158. Thus, the buffer layer 152, the dielectric layer having a high dielectric constant 154, the selective bottom barrier layer (not shown), the work function metal layer 156 and the selective top barrier layer (not shown) are all have U-shaped cross-sectional profiles. Then, sequential semiconductor processes may be performed to form a desired semiconductor structure. In another embodiment, the gate dielectric layer 122 is not removed to serve as buffer layer. Under this circumstance, there is no need to form a buffer layer after removing the electrode layer 124 and the buffer layer 152 of the final structure would have a linear cross-sectional profile instead of a U-shaped one.

Figure 10:
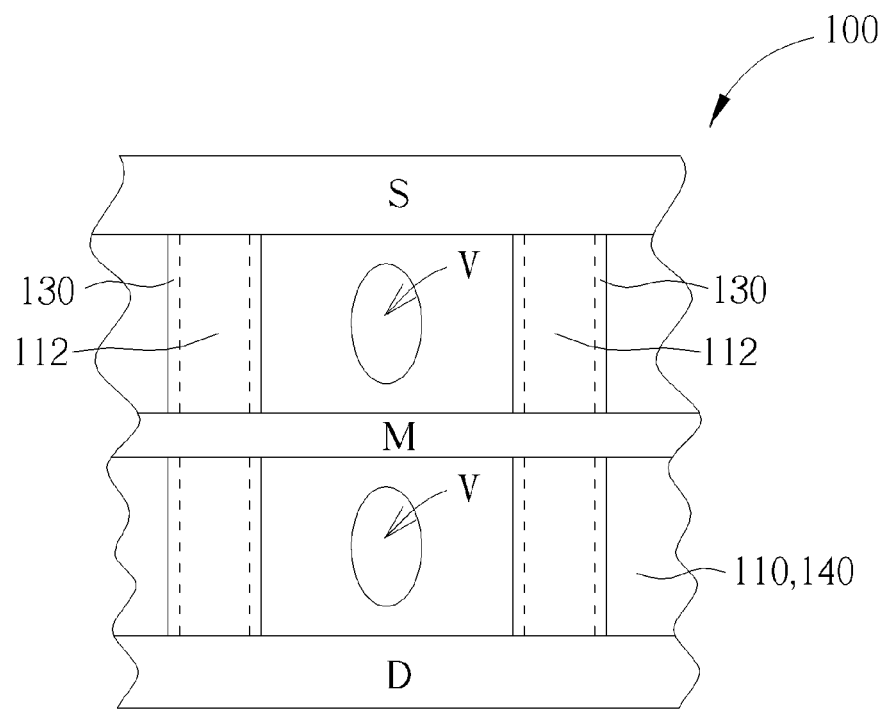
FIG. 10 schematically depicts a top view of a multigate field effect transistor according to an embodiment of the present invention.

According to the above, the processing steps of the multigate field effect transistor processes of the two said embodiments are slightly different and the formed multigate field effect transistors are almost the same, except for parts of the epitaxial structures 130 of the second embodiment being right below the metal gate M. However, the top views of the multigate field effect transistors of the two said embodiments are the same, as shown in FIG. 10, which schematically depicts a top view of a multigate field effect transistor according to an embodiment of the present invention. A multigate field effect transistor 100 includes at least two fin-shaped structures 112 located on a substrate 110. A metal gate M is disposed across the fin-shaped structures 112 and the substrate 110. An epitaxial structure 130 maybe selectively located on the fin-shaped structures 112 beside the metal gate M. Source/drains (not shown) are located in the fin-shaped structures 112 or/and the epitaxial structures 130 beside the metal gate M, and Source/drains (not shown) electrically connect a source end S and a drain end D. A dielectric layer 140 covers the fin-shaped structures 112 and the substrate 110, and voids V are located in the dielectric layer 140 between the fin-shaped structures 112. The disposed methods and the functions of each of the components are illustrated in said two embodiments, and are not described again.

To summarize, the present invention provides a multigate field effect transistor and process thereof, which forms voids in a dielectric layer between two fin-shaped structures, so that the parasitic capacitances of the multigate field effect transistor, especially between the fin-shaped structures, can be reduced. Preferably, the voids are located below the top of the fin-shaped structures. An epitaxial structure having a lateral widest part may be formed on each of the fin-shaped structures, enabling voids to be located below the level of the lateral widest parts, so that the locations, the sizes and the shapes of the voids can be controlled precisely. Besides, the locations, the sizes and the shapes of the voids can also be controlled by the depth and the shape of the isolation structure on the substrate between the fin-shaped structures. Moreover, processes of forming a dielectric layer with voids in the dielectric layer between the fin-shaped structures in the present invention can reduce the processing costs compared to processes that fully fill the dielectric layer (with no voids).

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A multigate field effect transistor, comprising:
   two fin-shaped structures located on a substrate;
   an epitaxial structure disposed on each of the two fin-shaped structures;
   a dielectric layer covering the substrate, the epitaxial structures and the two fin-shaped structures, and at least two voids located in the dielectric layer between the two fin-shaped structures, wherein the dielectric layer has a planar top surface higher than the epitaxial structures; and
   an isolation structure located on the substrate between the two fin-shaped structures, wherein the isolation structure has a bottom part located on the substrate between the two fin-shaped structures, and two sidewall parts respectively located on corresponding two sides of the two fin-shaped structures, wherein a horizontal width of a top surface of the bottom part is larger than a horizontal width of each of the sidewall parts.

2. The multigate field effect transistor according to claim 1, wherein the cross-sectional profile of each of the epitaxial structures has a lateral widest part.

3. The multigate field effect transistor according to claim 2, wherein the two voids are located below the lateral widest part.

4. The multigate field effect transistor according to claim 1, wherein the two voids are located below the tops of the two fin-shaped structures.

5. The multigate field effect transistor according to claim 1, further comprising:
   a gate structure disposed in the dielectric layer, across the substrate and the two fin-shaped structures, and between the two voids.

6. The multigate field effect transistor according to claim 5, further comprising:
   two source/drains respectively located in the two fin-shaped structures beside the gate structure.

7. A multigate field effect transistor, comprising: two fin-shaped structures located on a substrate; a dielectric layer covering the substrate and the two fin-shaped structures,
   and at least two voids located in the dielectric layer between the two fin-shaped structures;
   a gate structure disposed in the dielectric layer, across the substrate and the two fin-shaped structures, and between the two voids, wherein a top surface of the gate trims with is at a same height as a top surface of the dielectric layer;
   an isolation structure located on the substrate between the two fin-shaped structures, wherein the isolation structure has a bottom part located on the substrate between the two fin-shaped structures, and two sidewall parts respectively located on corresponding two sides of the two fin-shaped structures, wherein a horizontal width of the bottom part is larger than a total horizontal width of both of the sidewall parts.

* * * * *